US006784488B2

(12) United States Patent
Huang et al.

(10) Patent No.: US 6,784,488 B2
(45) Date of Patent: Aug. 31, 2004

(54) TRENCH-GATE SEMICONDUCTOR DEVICES AND THE MANUFACTURE THEREOF

(75) Inventors: Eddie Huang, Stockport (GB); Miron Drobnis, Manchester (GB); Martin J. Hill, Stockport (GB); Raymond J. E. Hueting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/293,991

(22) Filed: Nov. 12, 2002

(65) Prior Publication Data

US 2003/0094650 A1 May 22, 2003

(30) Foreign Application Priority Data

Nov. 16, 2001 (GB) .............................................. 0127479
Dec. 17, 2001 (GB) .............................................. 0130019
Sep. 20, 2002 (GB) .............................................. 0221838

(51) Int. Cl.[7] ............................................. H01L 29/72
(52) U.S. Cl. ....................... 257/330; 257/341; 257/344; 257/347
(58) Field of Search ................................ 257/330, 341, 257/344, 347

(56) References Cited

U.S. PATENT DOCUMENTS 5,168,331 A     12/1992   Yilmaz ........................ 257/331
6,239,466 B1 *   5/2001   Elasser et al. ............... 257/341

FOREIGN PATENT DOCUMENTS

WO      WO8602202       8/1985    ......... H01L/29/167

OTHER PUBLICATIONS

"Power Semiconductor Devices" by B. Jayant Baliga, pp. 387 to 395.
Patent Abstracts of Japan; vol. 018, No. 213 (E–1538), Apr. 15, 1994, JP 06013621 A.

* cited by examiner

Primary Examiner—Edward Wojciechowicz
(74) Attorney, Agent, or Firm—Aaron Waxler

(57) ABSTRACT

A metal-oxide-semiconductor trench-gate semiconductor device in which a substantially intrinsic region (40) is provided below the gate trench (20), which extends from the base of the trench, substantially across the drain drift region (14) towards the drain contact region (14a), such that when the drain-source voltage falls during turn-on of the device its rate of decrease is higher. This reduces the switching losses of the device. The substantially intrinsic region (40) may, for example, be formed by implanting a region below the trench (20) with a damage implant.

9 Claims, 4 Drawing Sheets

TRENCH-GATE SEMICONDUCTOR DEVICES AND THE MANUFACTURE THEREOF

The present invention relates to trench-gate semiconductor devices. More particularly, it concerns insulated gate field-effect power transistors (commonly termed "MOSFETs") and the manufacture thereof.

Ideally, a power device would be able to switch between its "off-state" and "on-state" (and vice versa) with no power dissipation. However, substantial switching power losses occur in real power devices and there has always therefore been a desire to design the devices so as to minimise these losses, particularly for applications requiring high frequency switching.

The transient waveforms associated with a power MOSFET when the device is switched on and off are discussed for example in "Power Semiconductor Devices" by B. Jayant Baliga, pages 387 to 395 (hereinafter referred to as "Baliga"), the contents of which are hereby incorporated herein as reference material. Typical waveforms for such a device at turn-on when connected to an inductive load are schematically illustrated in FIGS. 1A to 1C herein. FIG. 1A shows the gate-source voltage, Vgs, FIG. 1B the drain-source current, Ids, and FIG. 1C the drain-source voltage, Vds.

Three consecutive time intervals are shown in FIGS. 1A to 1C, namely t1, t2 and t3. It can be seen that a significant proportion of the power dissipation occurs during the intervals t2 and t3. In t2, Vds is at its maximum blocking value and Ids rises, whilst in t3, Ids is relatively high and Vds falls from its maximum value. Similar waveforms are generated in reverse during turn-off.

It is an aim of the present invention to provide a trench-gate semiconductor device with reduced power losses and a method for manufacturing the device.

According to the invention, a trench-gate semiconductor device includes: a semiconductor body comprising a source region and a drain region of a first conductivity type, having therebetween a channel-accommodating region of an opposite, second conductivity type, the drain region comprising a drain drift region and a drain contact region, with the drain drift region between the channel-accommodating region and the drain contact region, and the drain drift region being doped to a lesser degree than the drain contact region; and an insulated gate provided in a trench, the trench extending through the channel-accommodating region into the drift region, wherein the drain drift region has a substantially intrinsic region below the trench, the substantially intrinsic region extending from the bottom of the trench, substantially across the drain drift region towards the drain contact region, such that when the drain-source voltage falls during turn-on of the device its rate of decrease is higher. This reduces the switching losses of the device.

The references herein to a higher rate of decrease and reduced switching losses are relative to an equivalent device without the substantially intrinsic region having instead material in conformity with the remainder of the drift region.

The invention further provides a method of manufacturing a trench-gate semiconductor device in a semiconductor body having a source region and a drain region of a first conductivity type, with a channel-accommodating region therebetween of a second conductivity type, and an insulated gate provided in a trench, the drain region comprising a drain drift region and a drain contact region, with the drain drift region between the channel-accommodating region and the drain contact region, and the drain drift region being doped to a lesser degree than the drain contact region, the method including the steps of:

(a) etching the trench through the semiconductor body into the drain drift region; and (b) forming a substantially intrinsic region below the trench, which extends from the base of the trench, substantially across the drain drift region towards the drain contact region, such that when the drain-source voltage falls during turn-on of the finished device its rate of decrease is higher. This reduces the switching losses of the device.

The present invention yet further provides a method of manufacturing a trench-gate semiconductor device in a semiconductor body having a source region and a drain region of a first conductivity type, with a channel-accommodating region therebetween of a second conductivity type, and an insulated gate provided in a trench, the drain region comprising a drain drift region and a drain contact region, with the drain drift region between the channel-accommodating region and the drain contact region, and the drain drift region being doped to a lesser degree than the drain contact region, the method including the steps of:

(a) etching a groove through the semiconductor body, substantially through the drain drift region towards the drain contact region; and (b) providing substantially intrinsic semiconductor material in a lower portion of the groove, defining the trench for the insulated gate in the upper portion of the groove, such that when the drain-source voltage falls during turn-on of the finished device its rate of decrease is higher.

The present invention is based on a development in understanding by the present inventors of the FIG. 1C characteristic. It is found that the fall of Vds during the time interval t3 is in practice for all power MOSFETs not linear as illustrated, but drops rapidly in the initial part of t3, and then decays more slowly to a final value (equal to the product of the drain-source on resistance and the drain current). This waveform is shown schematically in FIG. 2.

Vds falls at different rates during t3 because the gate-drain capacitance (Cgd) is a function of voltage. Cgd can effectively be considered as two capacitors in series, one due to the gate oxide layer, and the other due to the depletion width in the silicon. At high values of Vds, the depletion width is wide and so'Cgd due to the depletion width is much smaller than Cgd due to the oxide layer. Therefore the total gate-drain capacitance is low. At low Vds values, Cgd is mainly dominated by the capacitance of the gate oxide. In t3, as shown in FIG. 1A, Vgs is substantially constant and thus the gate current, Ig, is approximately constant. Assuming that Ig is fixed, during t3, the rate of decrease of Vds is greater at high values of Vds because Cgd is lower, leading to a Vds waveform of the shape illustrated in FIG. 2.

The inventors have devised a device configuration in which Vds falls even faster during the initial portion of t3, as substantial losses occur in the early part of t3, leading to a significant reduction in the switching losses at turn-on. In particular, the device includes a substantially intrinsic region at least below the trench. This serves to maintain a greater depletion width for longer during turn-on, therefore providing a lower value of Cgd for longer, which in turn leads to a faster decrease in the value of Vds during the initial part of t3. The steady-state on and off characteristics of the device are not significantly affected, because the main portion of the drift region retains its doping concentration (of the first conductivity type) over the main area of the device between gate trenches.

It will be appreciated that similar considerations apply to the converse situation of turn-off of the device. Initially, Cgd will be relatively high and so the rate of increase of Vds will be low. As the voltage increases, the depletion becomes wider and so Cgd decreases, thus increasing the rate of rise of voltage. During this phase, the presence of the substantially intrinsic region will result in a greater depletion width and a smaller Cgd at any given drain-source voltage than in a device without the substantially intrinsic region, so that Vds rises even more sharply than would otherwise be the case. Thus, the rate of increase of Vds is higher. This results in lower power losses at turn-off.

The substantially intrinsic region extends from the bottom of the trench, substantially across the drain drift region. Preferably, it extends at least halfway, or more preferably two thirds of the way or more, across the drift region. Its effect may be further enhanced if it extends completely across from the trench to the drain contact region.

In preferred embodiments, the substantially intrinsic region is confined laterally to be substantially within the width of the trench, to minimise any influence it may have on the on-resistance of the device.

Embodiments of the invention will now be described by way of example and with reference to the accompanying schematic drawings, wherein:

FIGS. 1A to 1C show typical waveforms for a power MOSFET at turn-on;

Figure 1A:
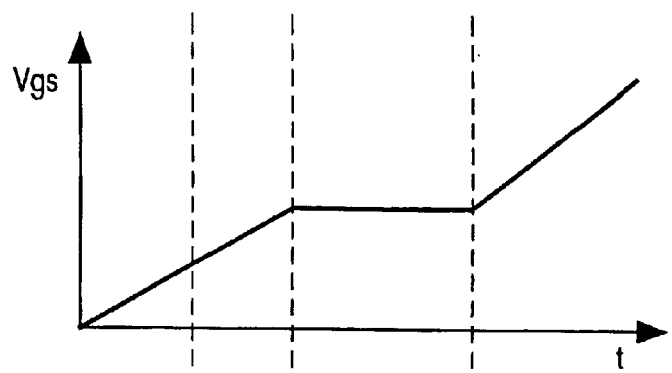
Figure 1B:
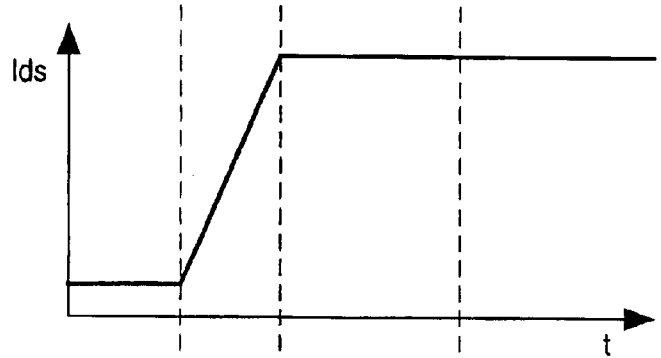
Figure 1C:
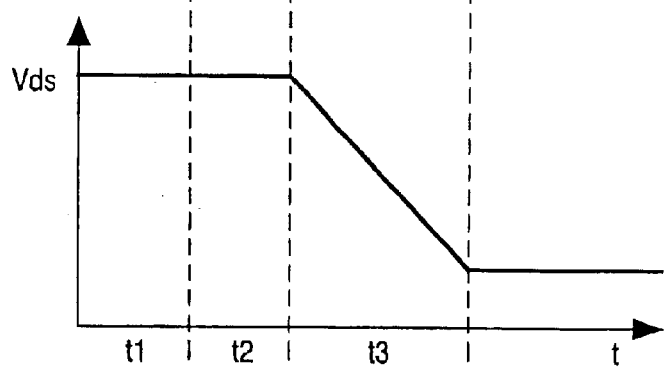

It should be noted that the Figures are diagrammatic and not drawn to scale. Relative dimensions and proportions of parts of these Figures have been shown exaggerated or reduced in size, for the sake of clarity and convenience in the drawings.

Figure 8:
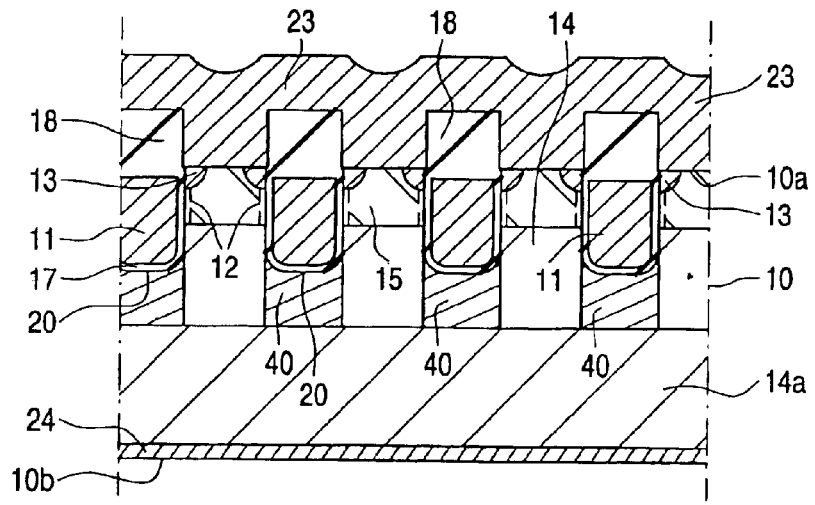

FIG. 8 illustrates an exemplary embodiment of a power semiconductor device having a trench-gate 11. In the transistor cell areas of this device, source and drain regions 13 and 14,14a, respectively, of a first conductivity type (n-type in this example) are separated by a channel-accommodating body region 15 of the opposite second conductivity type (i.e. p-type in this example). The drain region comprises a low doped drift region 14 adjacent a drain contact region 14a. The drift region consists, for example, of an epitaxial layer of high resistivity, which is deposited on a substrate contact region 14a of high conductivity.

The gate 11 is present in a trench 20 which extends through the regions 13 and 15 into an underlying portion of the drift region 14. The application of a voltage signal to the gate 11 in the on-state of the device serves in known manner for inducing a conduction channel 12 in the region 15 and for controlling current flow in this conduction channel 12 between the source and drain regions 13 and 14,14a.

The source region 13 is contacted by a source electrode 23 at the top major surface 10a of the semiconductor body 10. The drain contact region 14a is contacted at the bottom major surface 10b of the device body by the drain electrode 24.

An intrinsic or substantially intrinsic region 40 is provided below each trench 20. If the region is doped, it will be of the first conductivity type (i.e. n-type in this example), but only lightly so, such that it is close to intrinsic. Hence, the portion of the drift region below the trench is doped to a lesser extent than the main portion of the drift region that separates the drain contact region from the channel-accommodating region in the main device area between trenches.

No plan view of the cellular layout geometry is shown in the drawings, because the configurations and methods described herein may be used for quite different, known cell geometries. Thus, for example the cells may have a square geometry, or they may have a close-packed hexagonal geometry or an elongate stripe geometry. In each case, the trench 20 (with its gate 11) extends around the boundary of each cell. FIG. 8 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

The inventors have further realised that the presence of an intrinsic or substantially intrinsic region 40 adjacent to the drain drift region 14 produces the well known RESURF effect to some degree. When the device is in the forward blocking condition, the substantially intrinsic region will decrease the peak field in the drift region (relative to an equivalent device without the substantially intrinsic region having the same doping level in its drift region). Thus, according to the invention, a device may have a doping level in the drain drift region higher than that of an equivalent device without the substantially intrinsic region whilst having the same breakdown voltage. In the present context, "an equivalent device without the substantially intrinsic region" means a device having material in conformity with the remainder of the drift region instead of the substantially intrinsic region. The increased doping level in the drain drift region decreases the on resistance of the device. This may counteract any increase in the on resistance of the device which may occur as a result of the presence of the substantially intrinsic region reducing the ability of the current to spread underneath the gate trench.

Furthermore, as the presence of the RESURF effect decreases the peak field in the drift region (relative to a device without the substantially intrinsic region having instead material identical to the remainder of the drift region, and the same doping level in the drift region), this may be exploited by reducing the width of the channel-accommodating region. For a given doping level in the channel-accommodating region, the width required is proportional to the peak field. As the peak field in the drift region is reduced, then the width of the depletion in the channel-accommodating region will be smaller. Thus, the width of the channel-accommodating region may be similarly reduced. This will mean that the length of the channel-accommodating region adjacent the gate will be less, hence the channel length will be less leading to a lower channel resistance. This is particularly beneficial for medium to low voltage devices, having breakdown voltages of about 100V or less or about 50V or less, respectively, in which the on resistance may be mainly determined by the resistance of the channel-accommodating region.

It will be appreciated that the effect of RESURF described above may be exploited in a given device to achieve either of the described benefits or both benefits to a lesser extent, to suit particular requirements.

Successive stages in the fabrication of the transistor cells of FIG. 8 will now be described with reference to FIGS. 3 to 7.

Figure 3:
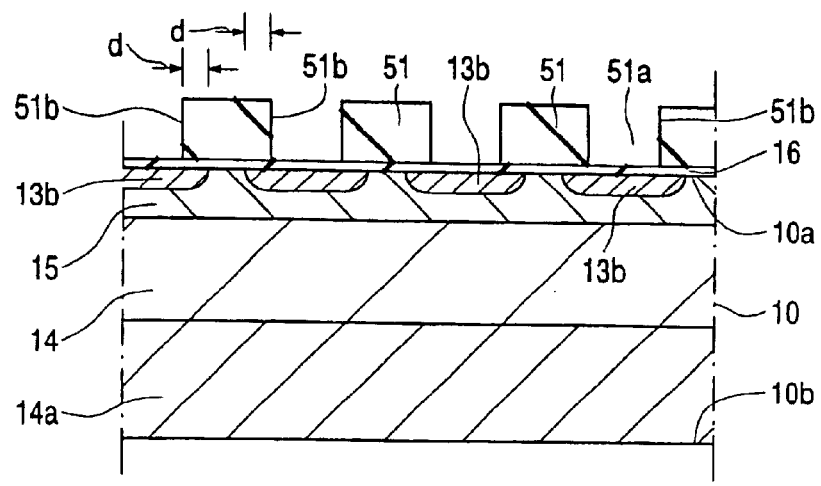
FIGS. 3 to 8 are cross-sectional views of transistor cell areas of a semiconductor body at successive stages in the manufacture of a trench-gate semiconductor device by one example of a method in accordance with the present invention, to provide a device embodying the invention as shown in FIG. 8.

The elements of the transistor cells shown in FIG. 3 may be formed using known processes, which are not therefore described in detail here. In this example, a thin layer 16 of silicon dioxide or other suitable insulator overlies the top major surface of the semiconductor body 10. A mask 51 is provided over layer 16 and may be formed in a standard manner using photolithography and etching. The mask defines windows 51a, and may be formed of silicon nitride for example. Regions 13b comprise implanted and diffused donor ions, which eventually define the source regions. The regions 13b extend laterally below the mask 51 at a distance d beyond the masking edge 51b of each window 51a. These diffused regions 13b form an hexagonal grid pattern in the case of hexagonal geometry cells. In a typical example, the lateral distance d is 0.1 to 0.5 micron.

Low doped drain drift region 14 may typically be grown as an epitaxial layer of the first conductivity type. The doping concentration of the drift region may be substantially uniform throughout its depth. Nevertheless, it may be preferable to vary the concentration across the drift region. In particular, providing a doping profile with the concentration decreasing (for example in a linear manner) in the direction from the drain contact region 14a towards the channel-accommodating region 15 may reduce the on-resistance of the device.

Figure 4:
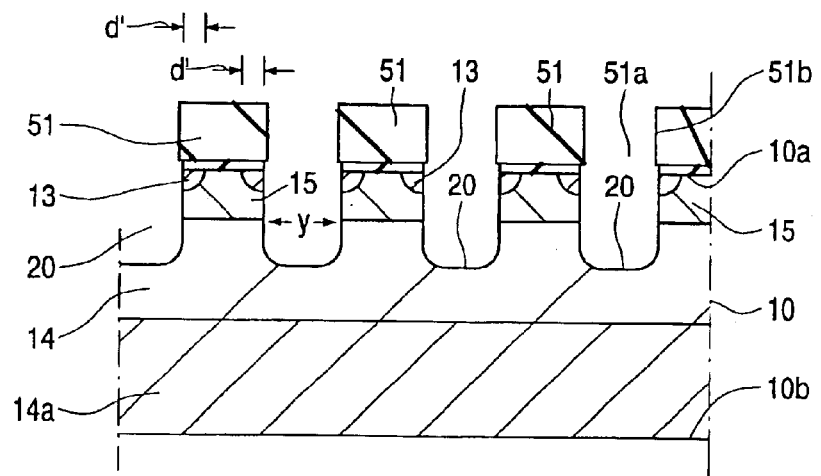

An etching treatment is carried out at the windows 51 a of the mask 51. When a thin oxide layer (such as 16) is present, this oxide layer is first etched away at the windows 51a. A silicon-etching treatment is then carried out in known manner, using the mask 51 as an etchant mask, to etch the trench 20 into the silicon body 10 at the windows 51a. The resulting structure is illustrated in FIG. 4. The layout pattern of the trench 20 is an hexagonal grid when an hexagonal geometry device is being manufactured. The remaining portions of the diffused regions 13b that adjoin the trench 20 form the source regions 13 of the transistor cells. The lateral extent d' of the source region 13 is determined by the extent to which the trench etching extends under the mask 51 beyond the edge 51b. This can be well-controlled using anisotropic plasma etching for at least most of the depth of the trench 20. However, it can be advantageous to use a final brief isotropic etch in order to round the bottom corners of the trench 20. The width y of the etched trench 20 may be, for example, in the range of 0.5 to 1.0 micron.

In device manufacturing processes other than the example illustrated in the Figures, it may be advantageous to etch the trench at an earlier stage, for example, prior to implantation of the source and channel-accommodating regions.

Figure 5:
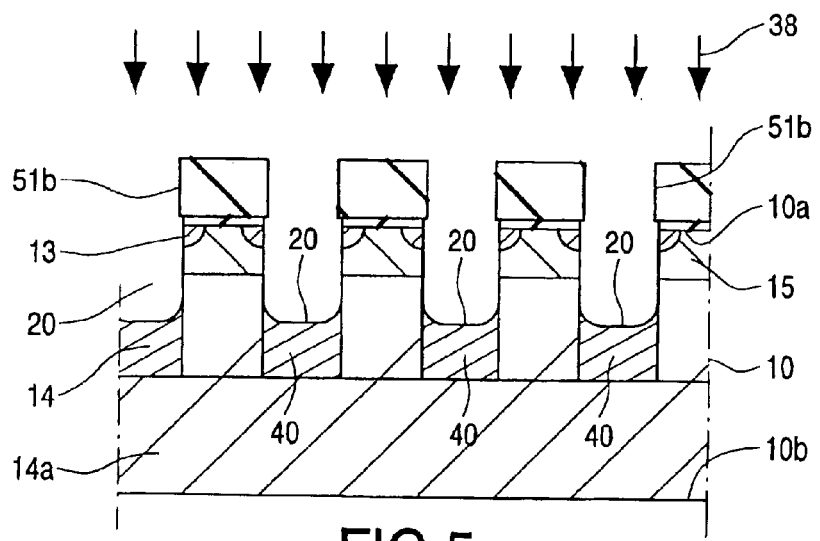

Next, a damage implant step is executed, as shown in FIG. 5. A heavy dose of a suitable species 38 such as protons for example is applied to the area at the bottom of the trench 20. This creates the intrinsic or substantially intrinsic region 40 which extends substantially from the base of the trench 20 to the drain contact region 14a. The remainder of the substrate is masked from the damage implant by the mask 51. In some embodiments, it may be preferable to retain the patterned photoresist layer used to define the mask 51 up to and during this step in order to provide additional masking.

The energy of the implant may be selected such that substantially all the damage occurs below the surface of the bottom of the trench to avoid damage to that surface. This minimises its effect on the subsequent formation of an oxide over the trench bottom when this is carried out after the implant (or minimises damage to the oxide itself when it is formed before the implant, see below).

Instead of protons, the species 38 may be ions of an inert gas, or silicon for example.

The region 40 is confined laterally to be substantially within the width of the trench to avoid increasing the on resistance of the device by impeding the flow of current from the channel through the drift region 14.

The damage implant creates a large number of deep energy levels inside the band gap of the semiconductor material forming the semiconductor body 10. These deep levels act as recombination centres that reduce significantly the charge-carrier lifetime by capturing free electrons in n-type material (as in this example), and free holes in p-type material. The electrons normally donated by the donors in n-type material to become free charge carriers in the conduction band will now tend to reside in these deep levels, making the material virtually intrinsic in its off-state.

When depleted, the negative charge due to the captured free electrons in these deep levels will compensate the positive charge on the ionised donors, thus rendering the net space charge close to zero. This serves to maintain a greater depletion width for a given drain-source voltage. The deep levels effectively provide a "self-adjusting" number of acceptors, which adjusts to be close to the number of donors, without taking electrons from the valence band to any significant degree. Accordingly, the amount of damage implant does not necessarily need to be controlled precisely, providing that an ample number of deep levels is created to accept the donor electrons.

Figure 2:
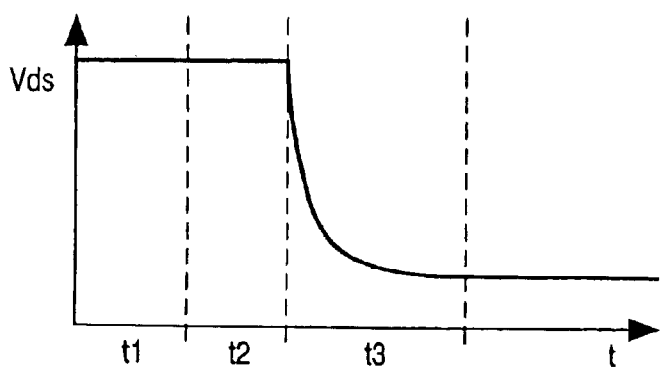
FIG. 2 shows an alternative version of the waveform of FIG. 1C.

One might expect the deep level acceptors to give up their electrons, once a depletion layer is formed. However, this process is slow, taking typically hundreds of microseconds. In the high frequency switching applications at which this invention is primarily directed (for example operating at around 250 kHz and above), switching occurs at such a rate that there is insufficient time for the deep levels to give up their electrons to a significant extent. For example, referring to FIG. 2, the duration of period t3 over which Vds falls may typically be of the order of tens of nanoseconds.

The temperature and duration of subsequent processes need to be controlled so as to avoid annealing out the damage implant in region 40. Similarly, the extent of the damage should be controlled having regard to the subsequent processing steps. Some annealing may nevertheless be advantageous to minimise the number dislocations within the silicon lattice caused by the damage implant.

A thin silicon dioxide layer 17 is then formed on the exposed faces of the trench 20. This may be achieved by deposition, or by an oxidation treatment. During this stage, the silicon nitride mask 51 serves to mask the silicon surface 10a. Formation of this oxide layer may alternatively be carried out prior to the damage implant step described above in relation to FIG. 5, although it may be preferable to form the oxide after the damage implant step to avoid disruption of the oxide by the implant.

Figure 6:
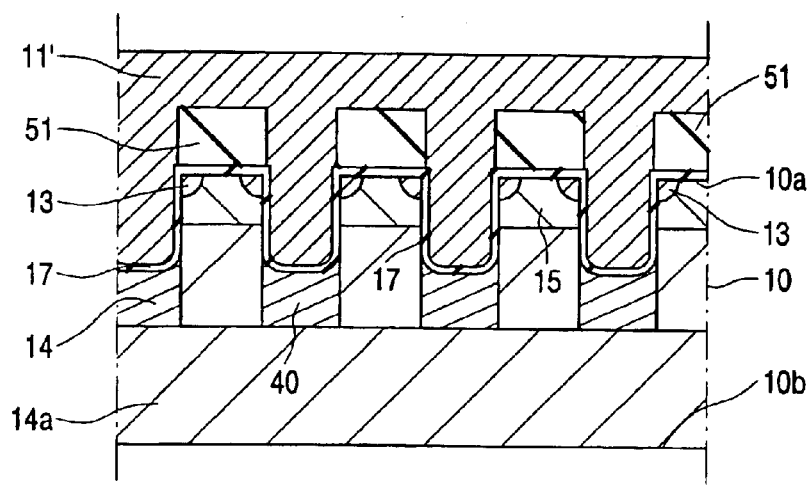

As illustrated in FIG. 6, doped polycrystalline silicon 11' may now be deposited in known manner in the windows 51a and on the nitride mask 51. This deposited polycrystalline silicon 11' is then etched back in a known manner to be left only in the trench 20 where it is to form the gate 11.

Figure 7:
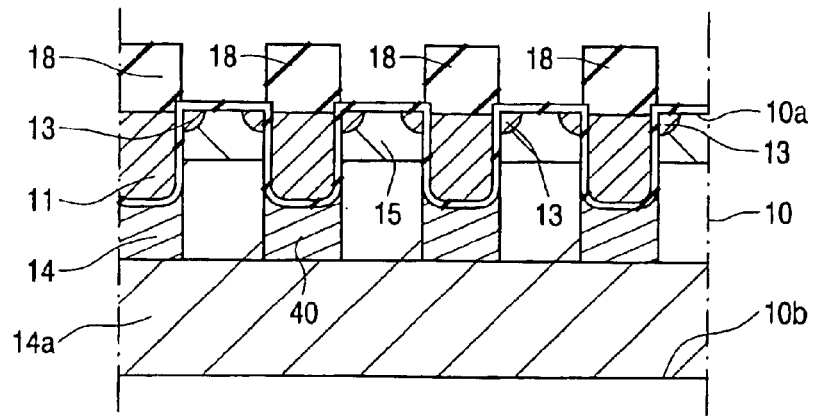

As illustrated in FIG. 7, a capping layer 18 of silicon dioxide is then formed in a known manner over the gate 11 and the nitride mask 51 removed. The silicon dioxide layer 18 may be formed by deposition and etch-back or by oxidation of the upper part of the gate 11. The structure resulting from the deposition approach is illustrated in FIG. 7.

When a thin oxide layer 16 is present on the body surface 10a, an oxide etching treatment is carried out to remove the layer 16 from over the surface 10a. This oxide etching treatment also thins slightly the insulating overlayers 18.

Electrode material (for example aluminium) is deposited to provide the source electrode 23 in contact with the exposed silicon surface 10a of the regions 13 and 15 between the insulating overlayers 18 on the trench-gates 11. The lateral extent of the source electrode 23 is determined in known manner by photolithographic definition and etching of the deposited electrode material. As illustrated in FIG. 8, the source electrode 23 can also extend on the insulating overlayer 18 over the trench-gate 11.

Instead of using the damage implant 38 described above to create the substantially intrinsic region 40, other processes may be employed in its place to achieve a similar result, providing that appropriate lateral localisation of the region can be achieved. For example, in an n-channel MOSFET, the proposed structure could be formed by implanting a low dose of p-type implant (such as boron, or other Group III elements) at a range of ion energies into the bottom of the trench. This would be followed by an annealing step and/or a short diffusion step to activate the p-type dopant. This implant may provide a region which is close to intrinsic as required, and having a net doping which is slightly n-type, or intrinsic. The implant compensates for the doping initially present in the region by introducing dopant of the opposite conductivity type at substantially the same level.

According to a further embodiment of the invention, the semiconductor body is formed substantially of silicon, the substantially intrinsic region includes a predetermined concentration of carbon, and a lifetime controlling impurity is provided in the device which is substantially located in the substantially intrinsic region. The introduction of a predetermined concentration of carbon into a localised region of a device enables close control of the distribution of a lifetime controlling impurity there, substantially restricting it to a predefined location.

The carbon atoms occupy lattice sites in the silicon of the semiconductor body. Although these atoms are electrically neutral, the inventors believe that when larger impurity atoms such as gold or platinum are introduced it is energetically favourable for these impurities to occupy lattice sites adjacent to the smaller carbon atoms to reduce local lattice strain. The impurity becomes associated with the predetermined concentration of carbon. It is thought by the inventors that the association between the impurity ions ($M^+$) and the carbon atoms (C) on lattice sites produces $C-M^+$ complexes with significant capture cross-sections.

Typically, the concentration profile of the impurity substantially corresponds to that of the carbon, the carbon profile being predetermined and controlled. Thus, the carbon may be employed to impose a specific profile on the impurity, according to the requirements of a particular device configuration. The extent to which the impurity is taken up by the carbon region may be controlled by careful control of the temperature the device is exposed to during its manufacture. Temperatures lower than normally used for diffusion of a lifetime controlling impurity may be sufficient to achieve the desired result owing to the association between the carbon atoms and the impurity. The reduced temperatures may provide a more confined overall impurity distribution.

Thus, a substantially intrinsic region may be formed by providing a predetermined concentration of carbon in a region below the trench, and heating the body such that a lifetime controlling impurity within the body becomes substantially located in the carbon region. The heating step may be carried out specifically to associate the impurity with the carbon region, or it may form part of another process, later in the fabrication of the device.

The carbon atoms may be provided by implantation and/or diffusion, using a suitable mask to confine laterally the implantation or to restrict the surface area exposed during diffusion of impurities into the base of the trench. Alternatively, the carbon may be introduced during epitaxial growth of the drain drift region 14. This approach is relatively low cost, and the distribution (that is, the concentration) of the added carbon vertically, and laterally where appropriate, can be accurately controlled and may be restricted to a well defined, discrete region or regions.

The impurity may typically be introduced by diffusion. A suitable impurity may be gold or platinum for example. It will be appreciated that a large number of other impurities known in the art could be used to control carrier lifetime in this manner. It may be preferable to add the impurity relatively late in the manufacturing sequence to minimise any alteration of its distribution by subsequent processes, although pinning of the impurity by the carbon will tend to reduce its susceptibility to movement by later heating.

Typically, the carbon concentration in the substantially intrinsic region will be of the order of $10^{12}$ to $10^{16}$ atoms/cm$^3$. Lifetime controlling impurity atoms are present in the region in a concentration of the order of $10^{11}$ to $10^{13}$ atoms/cm$^3$, for example.

A substantially intrinsic region may be formed by incorporating a lifetime controlling impurity into a region below the trench. As noted above, the impurity may preferably be localised using a predetermined concentration of carbon atoms in the region. Appropriate impurities form deep energy levels inside the band gap of the semiconductor body.

Figure 9:
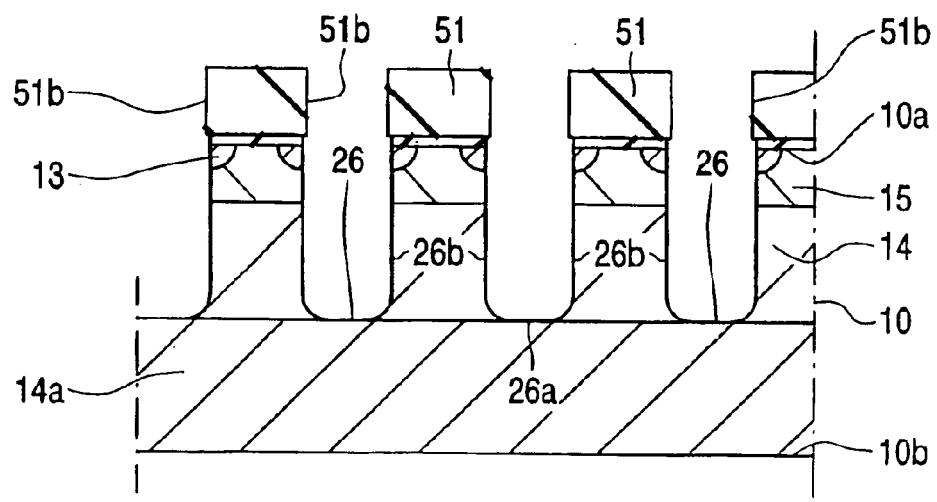

According to another embodiment, the intrinsic (or substantially intrinsic) region 40 is formed by deposition or growth of intrinsic (or substantially intrinsic) semiconductor material. Instead of etching the trench 20 at the FIG. 4 stage, a groove 26 is etched into the semiconductor body 10, as far as the intended depth of the intrinsic region. Preferably, the groove will be etched down to the drain contact region 14a. This is illustrated in FIG. 9. The groove is then filled with (substantially) intrinsic semiconductor material which is anisotropically etched back, preferably again using the nitride mask 51, to leave trenches with (substantially) intrinsic semiconductor material below, corresponding to the structure shown in FIG. 5. The device may then be completed by following the process flow described above in relation to FIGS. 6 to 8.

The (substantially) intrinsic semiconductor material used to fill the trench as discussed in the preceding paragraph may be epitaxially grown silicon or alternatively, polycrystalline silicon, for example.

It may be preferable to provide a layer of insulating material between the substantially intrinsic region and the drain drift region. This may serve to reduce or eliminate any current leakage which may otherwise occur at the interface between the drift region and the groove 26 infill of (substantially) intrinsic semiconductor material.

Figure 10:
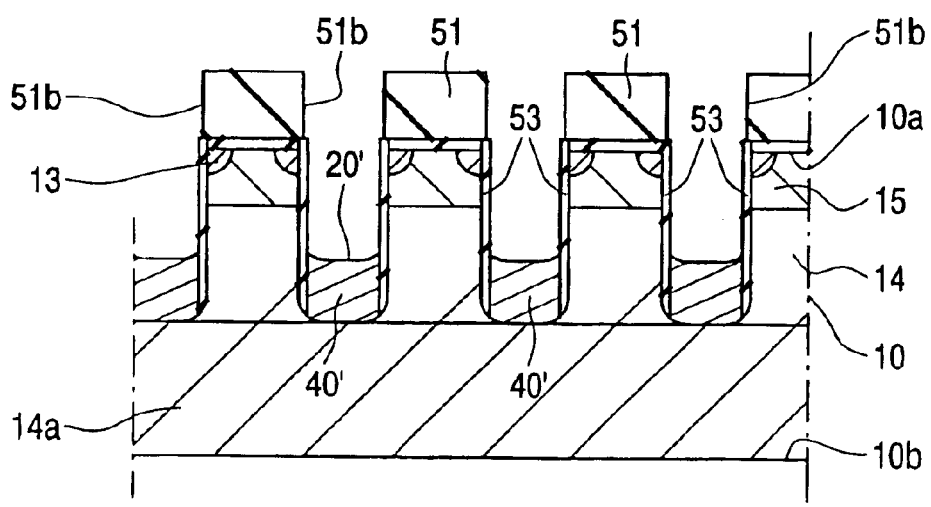

A structure including such a layer of insulating material between the substantially intrinsic region and the drain drift region may be formed by etching grooves 26 into the semiconductor body 10 as described in relation to FIG. 9. A layer of the insulating material (silicon dioxide, for example) is then uniformly deposited or grown over the bottom 26a and sidewalls 26b of the groove 26. Alternatively a layer of silicon dioxide may be grown by oxidation. An anisotropic etch is used to remove the insulating material overlying the bottom 26a of the groove. Then the groove 26 is then filled with (substantially) intrinsic semiconductor material which is anisotropically etched back, preferably again using the nitride mask 51, to leave a trench 20' with (substantially) intrinsic semiconductor material below, corresponding to the structure shown in FIG. 10. As illustrated, layers 53 of insulating material extend between the region 40' of (substantially) intrinsic semiconductor material and the drift region 14. A further oxidation treatment may then be carried out to form a layer of silicon dioxide over the upper surface of the region 40' of (substantially) intrinsic semiconductor material to complete a gate insulating layer over the walls of the trench. The process flow of FIGS. 6 to 8 may then be followed as appropriate to complete the device.

It may be desirable to thin or remove entirely the exposed portions of the layers 53 of insulating material by an etching process prior to the further oxidation treatment to form the gate oxide, in order to reduce the oxide thickness between the gate 11 and the channel-accommodating portion 15.

It will be evident that many other variations and modifications are possible within the scope of the present invention. Usually the conductive gate 11 is formed of doped polycrystalline silicon as described above. However, other known gate technologies may be used in particular devices. Thus, for example, additional materials may be used for the gate, such as a thin metal layer that forms a silicide with the polycrystalline silicon material. Alternatively, the whole gate 11 may be of a metal instead of polycrystalline silicon. FIG. 8 illustrates the preferred situation of an insulated gate structure, in which the conductive gate 11 is capacitively coupled to the channel-accommodating body region 15 by a dielectric layer 17.

It may be advantageous to have a thicker gate insulating layer at or around the bottom of the gate than adjacent the channel accommodating region to reduce further the Cgd of the device.

FIG. 8 illustrates a device having a p-type channel-accommodating region 15 of a uniform depth in each cell, without any deeper, more highly doped (p+) region such as is often used to improve device ruggedness. Some of the cells (not shown) of the device of FIG. 8 may comprise a deeper, more highly doped (p+) region instead of the channel-accommodating region 15. These deeper, more highly doped (p+) regions may be implanted through windows of an appropriate mask, for example before the FIG. 3 stage or in a modification of the FIG. 5 stage. It is also possible to implant a deeper, more highly doped (p+) localised region within an active cell having a channel-accommodating region 15, but the cell geometry is less compact in this case.

The particular example described above is an n-channel device, in which the regions 13, 14 and 14a are of n-type conductivity, the region 15 is of p-type, and an electron inversion channel 12 is induced in the region 15 by the gate 11. By using opposite conductivity type dopants, a p-channel device can be manufactured by a method in accordance with the invention. In this case, the regions 13,14 and 14a are of p-type conductivity, the regions 15a and 15b are of n-type, and a hole inversion channel 12 is induced in the region 15a by the gate 11. The substantially intrinsic region 40 may be lightly doped p-type in this embodiment.

Semiconductor materials other than silicon may be used for devices in accordance with the invention, for example silicon carbide.

A vertical discrete device has been illustrated with reference to FIGS. 3 to 8, having its second main electrode 24 contacting the region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 24 at the front major surface 10a, via a doped peripheral contact region which extends from the surface 10a to the depth of the buried layer.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during the prosecution of the present Application or of any further Application derived therefrom.

What is claimed is:

1. A trench-gate semiconductor device including:

a semiconductor body comprising a source region and a drain region of a first conductivity type, having there between a channel-accommodating region of an opposite, second conductivity type, the drain region comprising a drain drift region and a drain contact region, with the drain drift region between the channel-accommodating region and the drain contact region, and the drain drift region being doped to a lesser degree than the drain contact region; and an insulated gate provided in a trench, the trench extending through the channel-accommodating region into the drain drift region, wherein the drain drift region has a region below the trench which is doped to a lesser degree than the rest of the drain drift region, the region below the trench extending from the bottom of the trench, substantially across the drain drift region to the drain contact region, such that when the drain-source voltage falls during turn-on of the device its rate of decrease is higher.

2. A device of claim 1 wherein the substantially intrinsic region extends from the trench to the drain contact region.

3. A device of claim 1 wherein the substantially intrinsic region is confined laterally to be substantially within the width of the trench.

4. A device of claim 1 wherein the semiconductor body is formed substantially of silicon, the substantially intrinsic region includes a predetermined concentration of carbon, and a lifetime controlling impurity is provided in the device which is substantially located in the substantially intrinsic region.

5. A device of claim 4 wherein the concentration profile of the impurity substantially corresponds to that of the carbon.

6. A device of claim 1 wherein the substantially intrinsic region includes carrier recombination centres at deep energy levels inside the semiconductor band gap thereof.

7. A device of claim 1 wherein the doping level of the drain drift region is higher than that of a similar device without the substantially intrinsic region having the same breakdown voltage.

8. A device of claim 1 wherein the length of the channel-accommodating region adjacent the gate is less than that of a similar device without the substantially intrinsic region having the same drain drift region doping level.

9. A device of claim 1 wherein a layer of insulating material is provided between the substantially intrinsic region and the drain drift region.

* * * * *